United States Patent [19]

Ikeda

[11] Patent Number: 6,064,608
[45] Date of Patent: May 16, 2000

[54] SEMICONDUCTOR MEMORY DEVICE AND METHODS FOR INSPECTING AND MANUFACTURING THE SAME

[75] Inventor: Yuto Ikeda, Hyogo, Japan

[73] Assignee: Mitsubishi Denki Kabushiki Kaisha, Tokyo, Japan

[21] Appl. No.: 09/227,572

[22] Filed: Jan. 8, 1999

[30] Foreign Application Priority Data

Aug. 31, 1998 [JP] Japan .................................. 10-246014

[51] Int. Cl.⁷ .................................................. G11C 7/00
[52] U.S. Cl. ........................ 365/200; 365/185.9; 365/201; 365/225.7
[58] Field of Search ................................ 365/200, 201, 365/185.09, 225.7

[56] References Cited

U.S. PATENT DOCUMENTS

| | | | |
|---|---|---|---|
| 4,538,245 | 8/1985 | Smarandoiu et al. ................. | 365/200 |
| 5,513,144 | 4/1996 | O'Toole .................................. | 365/200 |
| 5,606,527 | 2/1997 | Kwack et al. ........................... | 365/201 |
| 5,617,364 | 4/1997 | Hatakeyama ............................ | 365/200 |
| 5,642,316 | 6/1997 | Tran et al. ............................... | 365/200 |
| 5,801,986 | 9/1998 | Matsumoto et al. ................ | 365/185.09 |

FOREIGN PATENT DOCUMENTS 08-180699   7/1996   Japan .

*Primary Examiner*—David Nelms
*Assistant Examiner*—Tuan T. Nguyen
*Attorney, Agent, or Firm*—McDermott, Will & Emery

[57] ABSTRACT

A semiconductor memory device comprising a plurality of word lines that come in two types: ordinary word lines planned to be used ordinarily, and redundant word lines to be used to replace any ordinary word line judged faulty. Boosting transistors are incorporated to boost all bit lines forcibly to a supply voltage. When the bit lines are brought to the supply voltage while the word lines are connected to ground, a memory cell may be found written with data represented by the supply voltage on the bit lines. This reveals a short-circuit between a bit line and the word line corresponding to the memory cell. The short-circuited word line is then replaced by a redundant word line.

4 Claims, 3 Drawing Sheets

SEMICONDUCTOR MEMORY DEVICE AND METHODS FOR INSPECTING AND MANUFACTURING THE SAME

BACKGROUND OF THE INVENTION

1. Field of the Invention

The present invention generally relates to a semiconductor memory device and methods for inspecting and manufacturing the same. More particularly, the invention relates to a semiconductor memory device wherein any word line short-circuited with a bit line may be replaced by a normal word line, as well as to methods for inspecting and manufacturing the memory device.

2. Description of the Background Art

As disclosed in Japanese Patent Application Laid-open No. Hei-8-180699, there are known semiconductor memory devices in which any bit line short-circuited with a word line may be replaced by a normal bit line for recovery from the defect. In such former semiconductor memory devices, when standby state is implemented, i.e., when no data is required to be written to or read from memory cells, bit lines carry a predetermined potential Vcc/2 as well as word lines are brought into conduction with a ground potential Vss.

If a bit line and a word line are short-circuited in the standby state, a leak current flows from the bit line to the word line. In that state, the bit line carries apotential whose level is lower than the potential Vcc/2. During manufacture of former semiconductor memory devices, a check is made to see if the bit line potential stays as high as the required level Vcc/2. If the potential of a given bit line is not found to be high enough, a defect is suspected of that bit line. Once a faulty bit line is identified in a semiconductor memory device during its manufacturing process, that bit line is replaced by a redundant circuit previously furnished in the memory device in question. In this manner, a short-circuit that may occur between a word line and a bit line in the semiconductor memory device is circumvented so that all bit lines will function normally in the device.

In the event of a short-circuit between a word line and a bit line in the former semiconductor memory device, a boosting voltage fed to the word lines leaks into the faulty bit line. This prevents the word line potential from being raised normally. Meanwhile, word line driving circuits are generally given greater capability than bit line driving circuits in the semiconductor memory device. Thus even if there is a short-circuit between a word line andabit line, the word line potential tends to be maintained at a level high enough to keep the memory device functioning. In the former semiconductor memory device, the short-circuited word line, therefore, is kept in use without being replaced by a redundant circuit.

However, if a bit line and a word line are short-circuited, the potential of the word line being boosted has little margin for letting the memory device function properly. Where the semiconductor memory device is used in long operating cycles, the word line potential can become so low as to trigger malfunction. In the face of such an eventuality, it is preferred that a bit line and a word line being short-circuited be replaced altogether by redundant circuits.

In former semiconductor memory devices, the presence of a short-circuit fails to affect the word line potential as severely as the bit line potential. This has made it difficult during the manufacture of former semiconductor memory devices to identify any word line being short-circuited therein with a bit line. Hence the difficulty arises of replacing the short-circuited word line by a redundant circuit during the semiconductor memory device manufacture.

SUMMARY OF THE INVENTION

The present invention has been conceived to solve the previously-mentioned problems, and a general object of the present invention is to provide a novel and useful semiconductor memory device and method for inspecting and manufacturing the same.

A more specific object of the present invention is to provide a semiconductor memory device wherein a word line short-circuited with a bit line may be replaced by a redundant circuit.

The above objects of the present invention are achieved by a semiconductor memory device including a plurality of bit lines and a plurality of word lines. The plurality of word lines include ordinary word lines and redundant word lines. The ordinary word lines are planned to be used ordinarily from the beginning. The redundant word lines are used if any ordinary word line is judged to have a fault. The semiconductor memory device also includes a word line replacing mechanism. The mechanism activates a specific redundant word line to replace a specifically selected word line. The semiconductor further includes a bit line boosting mechanism. The mechanism forcibly sets all bit lines to a supply voltage.

It is another object of the present invention to provide a method for inspecting a semiconductor memory device readily to identify therein any word line being short-circuited with a bit line.

The above objects of the present invention are achieved by a method for inspecting a semiconductor memory device having a plurality of bit lines and a plurality of word lines. The method includes a step for boosting the bit lines forcibly to a supply voltage while feeding the word lines with ground potential. The method also includes a step for judging a word line state based on memory cell data following the boosting of the bit line.

It is a further object of the present invention to provide a method for manufacturing a semiconductor memory device wherein any word line short-circuited with a bit line may be replaced by a redundant circuit for recovery from the defect.

The above objects of the present invention are achieved by a method for manufacturing a semiconductor memory device having a plurality of bit lines and a plurality of word lines. The method includes a step for boosting the bit lines forcibly to a supply voltage while feeding said word lines with ground potential. The method also includes a step for judging a word line state based on memory cell data following the boosting of the bit line. The method further includes a step for replacing a word line judged faulty with a previously furnished redundant word line.

Other objects and further features of the present invention will be apparent from the following detailed description when read in conjunction with the accompanying drawings.

DESCRIPTION OF THE PREFERRED EMBODIMENTS

Figure 1:
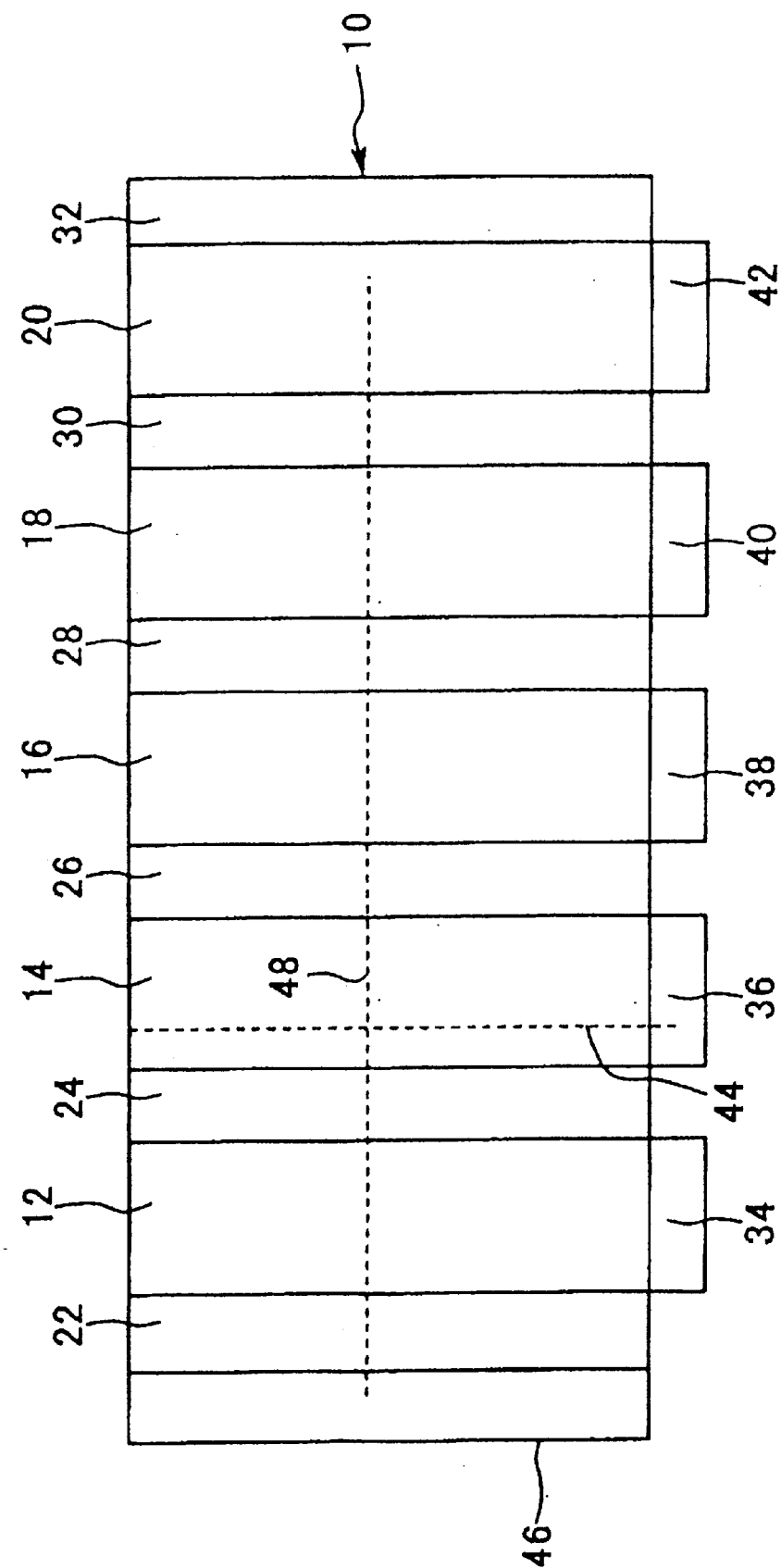
FIG. 1 is a plane view showing a semiconductor memory device practiced as a first embodiment of the present invention.

In the following, principles and embodiments of the present invention will be described with reference to the accompanying drawings. Throughout the drawings, like reference numerals designate like or corresponding parts, and descriptions of such parts are omitted where they are repetitive.

First Embodiment

FIG. 1 is a plan view of a semiconductor memory device 10 practiced as a first embodiment of this invention. The semiconductor memory device 10 comprises a plurality of memory arrays 12 through 20 and a plurality of sense amplifier columns 22 through 32. The memory arrays 12 through 20 and the sense amplifier columns 22 through 32 are arranged alternately.

The memory arrays 12 through 20 each comprise a plurality of memory cells arranged two-dimensionally in the row direction (horizontally in FIG. 1) and in the column direction (vertically in FIG. 1). Inside the memory arrays 12 through 20 are bit lines extending horizontally in FIG. 1 and attached commonly to a plurality of memory cells on each row. Also inside the memory arrays 12 through 20 are word lines extending vertically in FIG. 1 and attached commonly to a plurality of memory cells on each column. The sense amplifier columns 22 through 32 each include a plurality of sense amplifiers arranged in the column direction.

The memory cells in each of the memory arrays 12 through 20 are divided into first and second group cells. The first group cells are connected via bit lines to the sense amplifier columns located on their left-hand side, and the second group cells are coupled through bit lines to the sense amplifier columns located on their right-hand side. The plurality of sense amplifiers inside the sense amplifier columns 22 through 32 are each capable of conduction with a plurality of memory cells located on the right- and left-hand side. Each sense amplifier receives a signal from any one memory cell and outputs an amplified signal thereof.

At one edge of each of the memory arrays 12 through 20 are provided row selection signal generating circuits 34 through 42. The circuits 34 through 42 each supply a row selection signal in a suitably timed manner to one of the plurality of word lines contained in each of the memory arrays 12 through 20. A broken line 44 in FIG. 1 indicates a typical word line that carries a row selection signal from the row selection signal generating circuit 36.

At one edge of the semiconductor memory device 10 is provided a column selection signal generating circuit 46. The circuit 46 generates a column selection signal for selecting single row of sense amplifiers group from among the sense amplifiers constituting the sense amplifier columns 22 through 32. A broken line 48 in FIG. 1 denotes a typical column selection signal generated by the column selection signal generating circuit 46.

Figure 2:
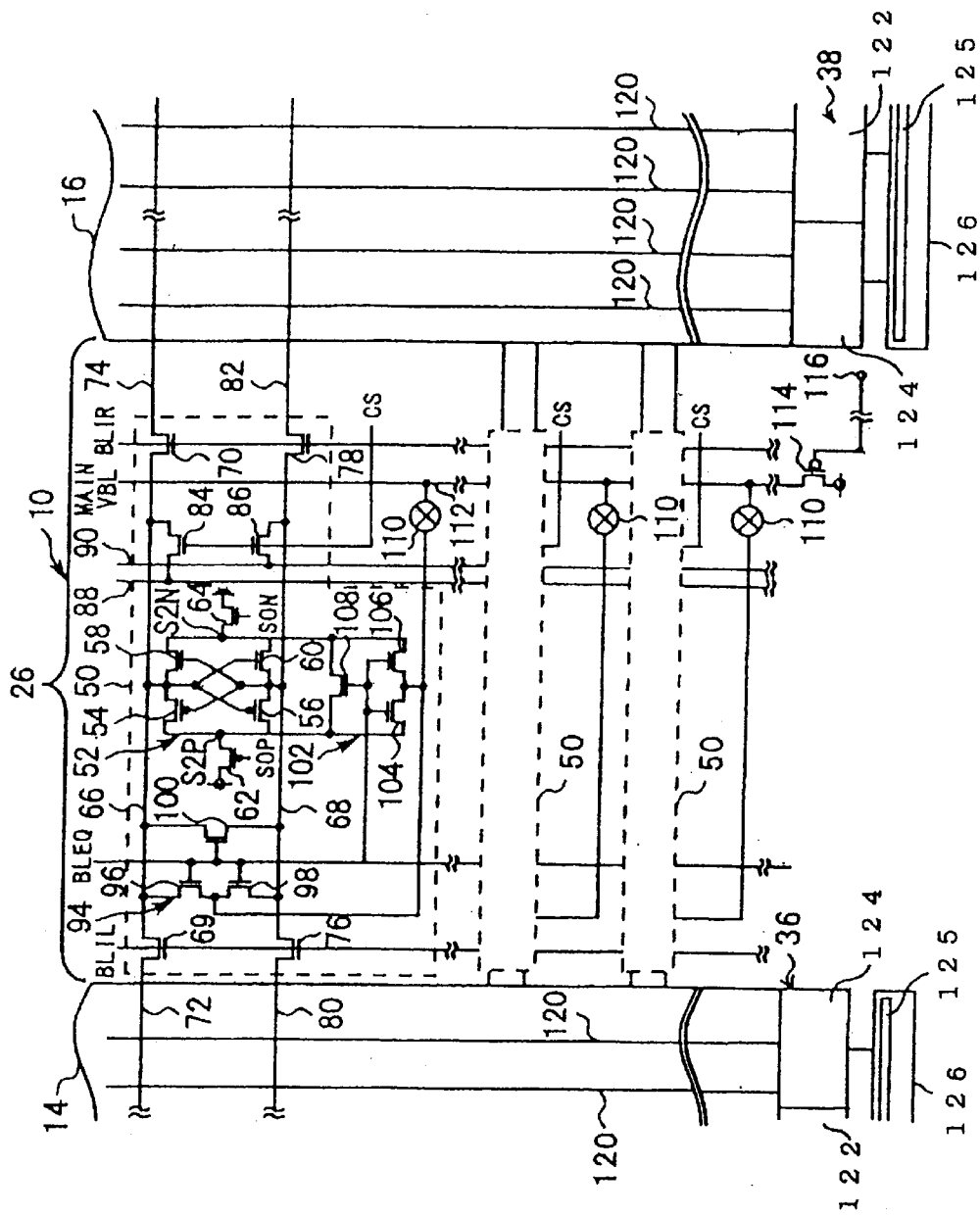
FIG. 2 is an enlarged view showing principal elements of the semiconductor memory device depicted in FIG. 1.

FIG. 2 is a partial enlarged view of the semiconductor memory device 10 constituting the first embodiment. Shown specifically in FIG. 2 are portions of memory arrays 14 and 16 and part of the sense amplifier column 26 interposed therebetween. In the semiconductor memory device 10, the sense amplifier columns 22 through 32 are identically structured. The structure of the sense amplifier column 26 is described below as a representative example of all sense amplifier columns.

The sense amplifier column 26 has a plurality of sense amplifier blocks 50. The blocks 50 include a plurality of blocks planned to be used from the beginning (called ordinary blocks hereunder) and a predetermined number of blocks to be replaced with any ordinary block if any fault of that block is detected (called redundant blocks). All sense amplifier blocks 50 are identical in structure.

More specifically, the sense amplifier blocks 50 each comprise a sense amplifier 52 as shown in FIG. 2. The sense amplifier 52 includes a pair of P-type MOS transistors 54 and 56 as well as a pair of N-type MOS transistors 58 and 60. The P-type MOS transistors 54 and 56 are commonly connected to a node S2P. In turn, the node S2P is connected to a power supply via another P-type MOS transistor 62 (called the activation transistor 62 hereunder). The N-type MOS transistors 58 and 60 are commonly connected to a node S2N which in turn is grounded through another N-type MOS transistor 64 (called the activation transistor 64 hereunder).

The gate terminals of the activation transistors 62 and 64 are fed with activation signals SOP and SON respectively. Given the activation signals SON and SOP, the sense amplifier 52 is activated or inactivated. The two activation signals SON and SOP are supplied commonly to all sense amplifiers 52 belonging to the same sense amplifier column 26.

The P-type MOS transistor 56 and the N-type MOS transistor 60 have their gate terminals connected to signal transmission line 66 whereas the P-type MOS transistor 54 and the N-type MOS transistor 58 are connected to signal transmission line 68 at their gate terminals. The two ends of the signal transmission line 66 are connected to bit lines (BL) 72 and 74 by way of bit line selection transistors 69 and 70 respectively. Both ends of the signal transmission line 68 are connected to bit lines (/BL) 80 and 82 through bit line selection transistors 76 and 78 respectively. In the sense amplifier block 50, the bit lines BL72 and /BL80 make up a bit line pair, and the bit lines BL74 and /BL82 constitute another bit line pair.

The bit line selection transistors 69 and 76 connecting the sense amplifier 52 to the memory cellarray 14 on the left-hand side of the same have their gates supplied with a bit line selection signal BLIL. The bit line selection transistors 70 and 78 connecting the sense amplifier 52 to the memory cell array 16 on the right-hand side thereof are supplied with a bit line selection signal BLIR at their gates. The left- and right-hand bit line selection signals BLIL and BLIR are supplied commonly to all sense amplifier blocks 50 belonging to the same sense amplifier column 26.

The signal transmission lines 66 and 68 are connected to input/output lines 88 and 90 via I/O transistors 84 and 86 respectively. The input/output lines 88 and 90 are furnished commonly with respect to all sense amplifier blocks 50 belonging to the same sense amplifier column 26. The gates of the I/O transistors 84 and 86 are supplied with a column selection signal CS from the column selection signal generating circuit 46 (see FIG. 1).

A bit line equalizer 94 is furnished interposingly between the signal transmission lines 66 and 68. The bit line equalizer 94 has three N-channel transistors 96, 98 and 100. The N-channel transistors 96 and 98 are connected in series between the signal transmission lines 66 and 68. The N-channel transistor 100 on the other hand is located alone between the signal transmission lines 66 and 68. The three N-channel transistors 96, 68 and 100 have their gates fed with a bit line equalizing signal BLEQ. The bit line equalizing signal BLEQ is supplied commonly to all sense amplifier blocks 50 belonging to the same sense amplifier column 26.

The sense amplifier block 50 also includes a sense amplifier equalizer 102 furnished in parallel with the sense amplifier 52. The sense amplifier equalizer 102 has three N-channel transistors 104, 106 and 108. The N-channel transistors 104 and 106 are connected serially between the nodes S2P and S2N; the N-channel transistor 108 is located solely between the nodes S2P and S2N. The three N-channel transistors 104, 106 and 108 have their gates fed with the above-mentioned bit line equalizing signal BLEQ.

A common connection of the N-channel transistor 96 and 98 in the bit line equalizer 94 and a common connection of the N-channel transistors 104 and 106 in the sense amplifier equalizer 102 are both connected via a fuse 110 to a main bit line voltage line 112. The main bit line voltage line 112 is furnished commonly with respect to all sense amplifier blocks 50 belonging to the same sense amplifier column 26. A main bit line voltage MAINVBL is fed to the main bit line voltage line 112. Normally, the main bit line voltage MAIN-VBL is kept at the predetermined voltage level Vcc/2.

As shown in FIG. 2, the main bit line voltage line 112 is supplied with a boosting voltage via a boosting transistor 114. The gate of the boosting transistor 114 is connected to a test signal input terminal 116. The test signal input terminal 116 stays High normally and is brought Low when the semiconductor memory device is inspected. The primary characteristic of the semiconductor memory device 10 as the first embodiment is that it comprises boosting transistors 114.

As depicted in FIG. 2, the memory cells 14 and 16 each include a plurality of word lines 120. Each word line 120 is connected to the row selection signal generating circuit 36 or 38. The word lines 120 are made up of two kinds of lines: ordinary word lines planned to be used from the beginning, and redundant word lines used to replace ordinary word lines found to be defective. The row selection signal generating circuits 36 and 38 each include an ordinary decoder 122 for controlling the ordinary word lines and a redundant decoder 124 for controlling the redundant word lines. The ordinary and redundant decoders 122 and 124 are connected to a pre-decoder 126 incorporating a fuse 125.

What follows is a description of how the semiconductor memory device 10 works as the first embodiment in its normal state. As mentioned above, the test signal input terminal 116 normally stays at the High level. In that state, the boosting transistor 114 remains off, so that the potential of the main bit line voltage line 112 is kept to the predetermined level Vcc/2. As a result, the bit line equalizer 94 and sense amplifier equalizer 102 are supplied with the voltage Vcc/2 in the normal state.

When data is written to or read from a memory cell in the semiconductor memory device 10 (i.e., in what is known as the active state), the bit line equalizing signal BLEQ is driven Low. If no such data-handling action is requested (i.e., in the standby state), the bit line equalizing signal BLEQ is driven High in the semiconductor memory device 10.

If the signal BLEQ is at the Low level, all transistors 96, 98 and 100 in the bit line equalizers 94 and all transistors 104, 106 and 108 in the sense amplifier equalizers 102 are turned off. In that case, the signal transmission lines 66 and 68 are isolated from one other, and the nodes S2P and S2N of each sense amplifier 52 are disconnected from each another. This makes it possible in the active state to have the signal transmission lines 66 and 68 fed with different potential levels and also have the nodes S2P and S2N supplied with different potential levels.

If the signal BLEQ is at the High level, all transistors 96, 98 and 100 in the bit line equalizers 94 and all transistors 104, 106 and 108 in the sense amplifier equalizers 102 are turned on. In such a case, the main bit line voltage Vcc/2 is fed equally to the signal transmission lines 66 and 68 as well as to the nodes S2P and S2N. This makes it possible in the standby state to keep the signal transmission lines 66 and 68 as well as the nodes S2P and S2N at the same potential level respectively.

With the semiconductor memory device 10, the activation signal SOP is brought High in the standby state and driven Low in the active state. Thus the activation transistor 62 is turned on in the active state and turned off in the standby state. On the other hand, the activation signal SON is held Low in the standby state and brought High in the active state. This means that the activation transistor 64, as with the other activation transistor 62, is turned on in the active state and turned off in the standby state.

With the semiconductor memory device 10 in the standby state, as described, the activation transistors 62 and 64 are both turned off, and the nodes S2P and S2N as well as the signal transmission lines 66 and 68 are all kept at the voltage level Vcc/2. In such a case, all transistors 54, 56, 58 and 60 in the sense amplifiers 52 are kept off in a stable fashion.

With the semiconductor memory-device 10 in the active state, the activation transistors 62 and 64 are both turned on, the nodes S2P and S2N are isolated from each other, and the signal transmission lines 66 and 68 are disconnected from each other as described. In that case, if the signal transmission line 66 is higher by DV in potential than the signal transmission line 68, the N-channel transistor 60 is turned on to connect the signal transmission line 68 to ground potential. As a result, the P-channel transistor 54 is turned on to feed the supply voltage Vcc to the signal transmission line 66. In this manner, the sense amplifier 52 in the active state amplifies the potential difference between the signal transmission lines 66 and 68.

When data is requested to be read from a memory cell in the semiconductor memory device 10, a row selection signal is first fed to one of a plurality of word lines included in the memory arrays 12 through 20. With the row selection signal supplied to a specific word line, all memory cells of the column corresponding to that word line are made ready to output data onto the bit line (BL or /BL).

In the semiconductor memory device 10, the bit lines BL72 and /BL80 are each capable of conduction with memory cells belonging to different columns. Likewise, the bit lines BL74 and /BL82 are each capable of connection with memory cells belonging to a different column. In the description that follows, the memory cell columns connectable to the bit lines BL72, /BL80, BL74 and BL82 will be called the first, the second, the third and the fourth group column, respectively. The above-mentioned row selection signal is generated in such a manner that a plurality of the first through the fourth group columns will not be activated simultaneously. That is, the same sense amplifier 52 is not supplied with data simultaneously from a plurality of memory cells.

With the semiconductor memory device 10 in the standby state, the bit line selection signals BLIL and BLIR are both held High. If the row selection signal is used to select the first or the second group column (left-hand side column), the right-hand side bit line selection signal BLIR is driven Low. If the third or the fourth group column (right-hand side column) is selected, the left-hand side bit line selection signal BLIL is brought Low. As a result, the signal transmission lines 66 and 68 always conduct to the left- and right-hand side bit lines BL72, BL74, /BL80 and /BL82 in the standby state; in the active state, the signal transmission lines 66 and 68 conduct only to the bit lines BL72 and /BL80 or to the bit lines BL74 and /BL82 on the side of the memory cells from which receiving data.

The memory cells activated upon receipt of the row selection signal output stored charges representing data onto the bit line (BL or /BL), i.e., onto the signal transmission line 66 or 68. When supplied with the stored charges, the signal transmission line 66 or 68 is raised in potential from Vcc/2 to Vcc by DV if the memory cell data is "1," and lowered from Vcc/2 to the ground potential Vss by DV if the memory cell data is "0."

As described, the potential difference occurring between the signal transmission lines 66 and 68 in the active state is amplified by the sense amplifier 52. Thus if the memory cells send the data "1" onto the signal transmission line 66 or 68, the signal transmission line that receives the data is brought to the potential level Vcc while the other signal transmission line is connected to ground potential Vss.

After amplification of the data by the sense amplifier, a column selection signal CS is supplied to a specific sense amplifier block 50. Upon receipt of the column selection signal CS, the particular sense amplifier block 50 has its I/O transistors 84 and 86 turned on. This causes the signal amplified by the sense amplifier 52 to be output over the input/output lines 88 and 90. In this manner, a memory cell is specified by a row and a column address in the semiconductor memory device 10 and data is read from the specified memory cell. Furthermore, when a memory cell is designated by a row and a column address in the semiconductor memory device 10, applying a suitable voltage to the input/output lines 88 and 90 causes data to be written to that designated memory cell.

During manufacture of the semiconductor memory device 10, a short-circuit can occur between the bit lines (BL and /BL) and word lines 120. In the standby state, all bit lines in the semiconductor memory device 10 are fed with the predetermined voltage Vcc/2 via the bit line equalizers 94; in the standby state, the word lines 120 are kept at the ground potential Vss. Thus if a bit line and a word line 120 are short-circuited, a leak current will flow from the bit line side to the word line side 120. This requires that the bit line short-circuited with the word line be disconnected from the memory circuitry.

With the semiconductor memory device 10 in the active state, the bit line short-circuited with the word line 120 is raised to the High potential level. When the word line 120 is activated, it is possible to write to the memory cell applicable to the word line 120 the data representing the level of the bit line corresponding to the memory cells on the activated word line. Where a short-circuit between the word line 120 and the bit line keeps the bit line potential High, the data to be written to the memory cells are only that which corresponds to the High level. It follows that in the semiconductor memory device 10, the presence of a short-circuit between a bit line and a word line can be judged by checking to see if Low-level data may be written to the memory cells.

The above-described technique provides checks on short-circuits between all bit lines and word lines in the semiconductor memory device 10 of the first embodiment during its manufacture. If any bit line is found to be short-circuited with a word line, the fuse 110 corresponding to that bit line is cut off illustratively by emission of a laser beam. The cut off of the fuse 110 causes the short-circuited bit line to be disconnected from the main bit line voltage line 112. That is, getting the fuse 110 to blow prevents reliably the flow of leak currents from the bit line side to the word line side 120 in the standby state.

If the fuse 110 has blown in the semiconductor memory device 10, the column selection signal generating circuit 46 supplies a redundant block with the column selection signal that would have designated the sense amplifier block 50 corresponding to the blown fuse. Once the fuse 110 is cut off, the functions of the sense amplifier block 50 corresponding to the fuse 110, of the bit lines connected to the block 50, and of the memory cells corresponding to the bit lines are all replaced by the components of the redundant block. In this manner, even if a short-circuit occurs between a word line 120 and a bit line in the semiconductor memory device 10 during its manufacturing process, the memory device can recover from it and function normally.

The potential of the word lines 120 in the semiconductor memory device 10 is boosted in the active state. Thus if a word line 120 is short-circuited with a bit line, a leak current can flow from the word line to the bit line in the active state. The row selection signal generating circuits 34 through 42 for boosting the potential of the word lines 120 have greater capability than the column selection signal generating circuit 46. As a result, the leak current does not cause a significant drop in the normal potential of the word lines 120 in the active state. This means that in ensuring the function of the semiconductor memory device 10, it is not mandatory to substitute a redundant word line for the word line 120 short-circuited with the bit line.

On the other hand, a leak current flowing from the word line side 120 to the bit line side always causes an appreciable decline in the margin of the normal potential on the word line 120 being boosted. Where the semiconductor memory device 10 operates in long cycles, the above kind of leak current can reduce the potential of the word line 120 down to its minimum required level. Thus any word line 120 short-circuited with a bit line should preferably be replaced by a redundant word line.

However, the potential of the word line 120 being boosted shows not much decrease regardless of any short-circuit with a bit line as described above. Thus it is difficult to detect short-circuits between word lines 120 and bit lines by simply checking the potential on the word lines 120 being boosted. Instead, during manufacture of the semiconductor memory device 10, possible defects of the word lines 120 are checked by carrying out the steps described below.

Figure 3:
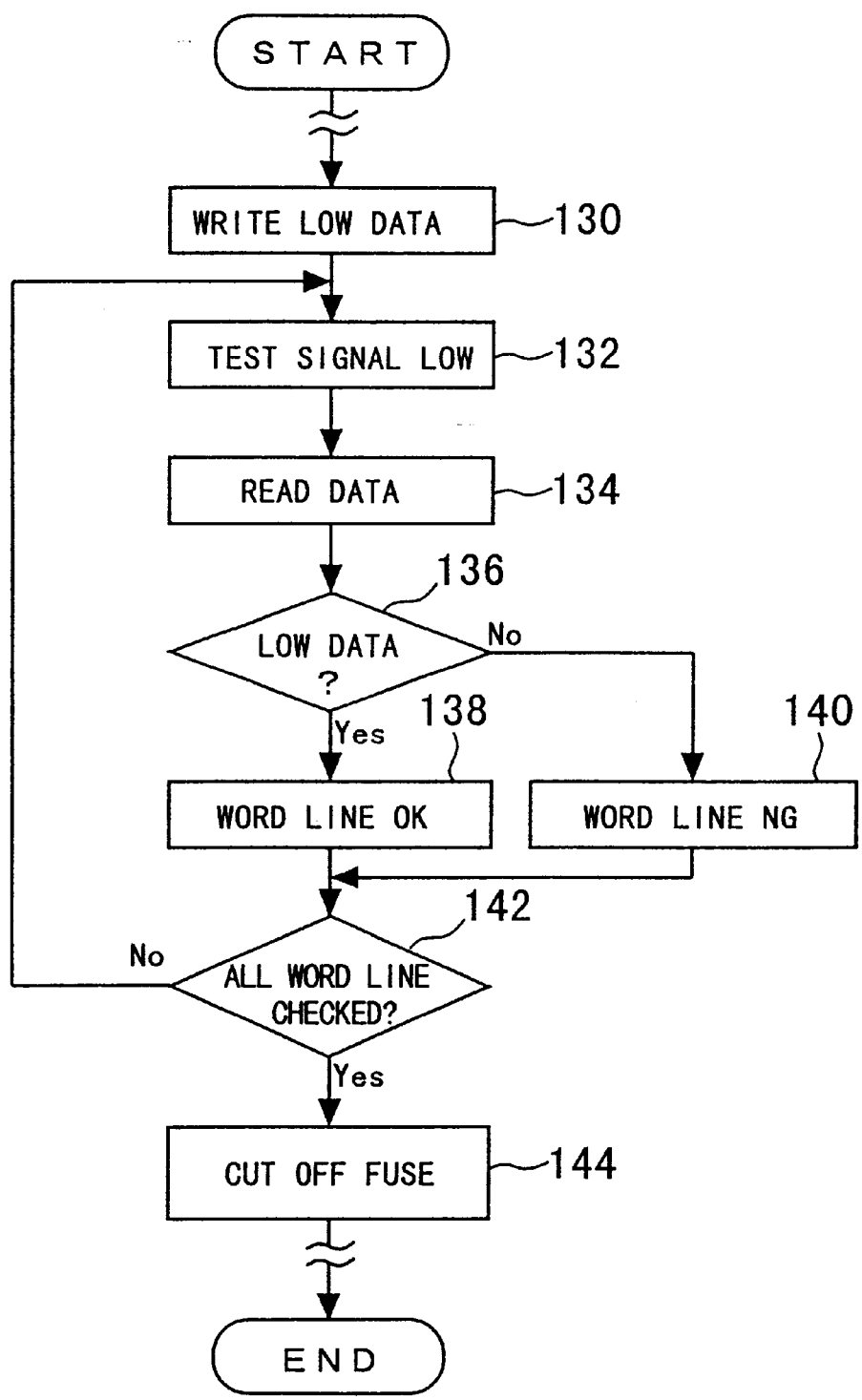
FIG. 3 is a flowchart showing a series of procedures performed during a manufacturing process of the semiconductor memory device depicted in FIG. 1.

FIG. 3 is a flowchart of steps in which a word line 120 short-circuited with a bit line is detected and is replaced with a redundant word line. The steps in FIG. 3 are carried out when the semiconductor memory device 10 is in the standby state, i.e., when the bit line equalizing signal BLEQ is High, the bit line selection signals BLIL and BLIR are High, and the word lines 120 are inactive. The series of processes in FIG. 3 is performed before the cut off of the fuse 110.

In step 130, data representing the Low level (i.e., data "0") is written to all memory cells. In step 132, a test signal is switched from the High level to the Low level. Carrying out step 132 turns on the boosting transistors 114 to feed the supply voltage Vcc to the main bit line voltage line 112. The supply voltage Vcc brought to the main bit line voltage line 112 is fed to all bit lines via the bit line equalizers 94 and signal transmission lines 66 and 68.

When the bit line potential is-boosted to the level Vcc, the potential of the word line 120 short-circuited with a bit line becomes sufficiently higher than the ground potential. In particular, the preceding steps pull up the potential VWL of the word line 120 by the voltage Vcc that is higher than a normal VBL (=Vcc/2). The voltage VWL is thus made to exceed a memory cell activation voltage Vth: The boosting transistor 114 in the present embodiment has a suitable driving capability so as to ensure that word line voltage level. When the voltage VWL of the word line 120 is raised to exceed the voltage Vth while the bit lines are being fed with the voltage Vcc, a voltage VWL-Vth higher than the ground potential, i.e., a voltage level approximately "1" is written to the memory cells.

Meanwhile, the potential VWL of the word lines 120 not short-circuited with the bit lines remains at the inactive level, i.e., at the ground potential even if the bit line potential is boosted to Vcc. As a result, the data in the memory cells corresponding to the word lines is held at the Low level, i.e., at "0." In the process above, of the memory cells retaining the data "0" beforehand, only those corresponding to the word line short-circuited with a bit line are written with the potential level approximating the data "1."

In step 134, data is read from the memory cells corresponding to a specific word line. In step 136, a check is made to see if the retrieved data is "0." If the data is found to be "0," the process proceeds to step 138. If the data is found to be other than "0," step 140 will be carried out next.

In step 138, the word line 120 checked in the current processing cycle is judged to be normal. In step 140, the word line 120 examined in the current processing cycle is judged to be short-circuited with a bit line.

In step 142, a check is made to see if all word lines 120 have been inspected. If any word line 120 is yet to be checked, step 136 is reached again. If all word lines are found to have been inspected, step 144 is reached.

Step 144 is the process of remedying the word line 120 judged to be short-circuited with a bit line. Specifically, in step 144, a suitable fuse 125 is cut out for recovery from failure of the word line 120. When the corresponding fuse 125 is cut off, the pre-decoder 126 substitutes the address of a redundant word line 120 for the address designating the word line 120 in question (ordinary word line) applicable to the blown fuse 125, and supplies the new address to the redundant decoder 124. This allows the redundant word line to replace the short-circuited word line 120, whereby the flow of leak currents from the word line 120 to the bit line is prevented unfailingly.

When a former semiconductor memory device 10 is in normal operation mode with the word lines 120 kept inactive, the bit lines are not boosted to the supply voltage Vcc. Such a low bit line potential in normal operation mode makes it difficult to detect accurately a faulty word line 120. In the first embodiment of this invention, by contrast, all bit lines are forcibly boosted to the supply voltage Vcc. This allows any word line 120 short-circuited with a bit line to be detected easily and precisely, so that the failed word line of the semiconductor memory device 10 can be replaced by a normal redundant word line during manufacture process of the device 10.

This invention, when embodied as described above, offers the following major benefits:

In the semiconductor memory device according to one aspect of the invention, bit lines can be forcibly set to a supply voltage. If a word line and a bit line are short-circuited, the supply voltage on the bit line raises the potential of the short-circuited word line in an inactive state to a level significantly higher than normal. This allows the short-circuited word line to be detected reliably. In the inventive semiconductor memory device, a redundant word line can be activated as needed instead of an ordinary word line. A word line short-circuited with a bit line may be thus replaced by a redundant word line for recovery from the failed word line.

In the semiconductor memory device having one preferred structure according to the invention, equalizers attached to each bit line pair may be in an equalized state and the main bit line voltage line may be set to the supply voltage in a test state. In such a case, the two bit lines constituting each bit line pair may be equally and forcibly set to the supply voltage.

In the semiconductor memory device having another preferred structure according to the invention, a short-circuit detected between a word line and an ordinary word line may be remedied by severing the fuse corresponding to the word line in question. With the appropriate fuse cut off, the failed ordinary word line is isolated within the memory device and replaced by a redundant word line. With this preferred structure, it is easy to substitute a redundant word line for any word line short-circuited with a bit line.

By the method for inspecting a semiconductor memory device according to another aspect of the invention, bit lines are forcibly set to the supply voltage while the word lines are being kept inactive. If a bit line and a word line are short-circuited in the above mentioned state, the potential of the shorted word line is raised to a level significantly higher than normal. This causes the memory cells corresponding to the word line to be written with the bit line potential, i.e., with data representing the supply voltage. In this manner, the inventive inspecting method allows any word line short-circuited with a bit line to be detected easily and reliably.

By the method for manufacturing a semiconductor memory device according to a further aspect of the invention, any word line short-circuited with a bit line is detected easily and reliably inside a semiconductor memory device and is replaced by a redundant word line during manufacture of the memory device in question. The inventive manufacturing method thus makes it easy to fabricate a semiconductor memory device wherein any word line short-circuited with a bit line is isolated and replaced by a redundant word line.

Further, the present invention is not limited to these embodiments, but variations and modifications may be made without departing from the scope of the present invention.

The entire disclosure of Japanese Patent Application No. Hei 10-246014 filed on Aug. 31, 1998 including specification, claims, drawings and summary are incorporated herein by reference in its entirety.

What is claimed is:

1. A semiconductor memory device comprising a plurality of bit lines and a plurality of word lines, wherein:

said plurality of word lines include ordinary word lines and redundant word lines, said ordinary word lines being planned to be used ordinarily from the beginning, said redundant word lines being used if any ordinary word line is judged to have a fault;

said semiconductor memory device further comprising:

word line replacing means for activating a specific redundant word line to replace a specifically selected word line;

bit line boosting means for forcibly setting all bit lines to a supply voltage; and further comprising a plurality of sense amplifiers;

wherein said plurality of bit lines include a plurality of bit line pairs each connected to a common sense amplifier;

wherein said semiconductor memory device also includes a plurality of equalizers each furnished to each of said bit line pairs for selectively bringing into either an equalized state or a nonequalized state, said equalized state being a state in which two bit lines constituting each bit line pair are equally supplied with a voltage of a main bit line voltage line, said nonequalized state being a state in which said two bit lines are left inactive; and wherein said bit line boosting means includes test state forming means for setting said main bit line voltage line to said supply voltage while bringing said equalizers into said equalized state.

2. The semiconductor memory device according to claim 1, wherein said word line replacing means includes:

fuses corresponding to said ordinary word lines; and redundant word line activating means used when an address of an ordinary word line judged faulty is designated after the fuse corresponding to the faulty word line is cut off, said redundant word line activating means thereupon activating a redundant word line to replace the designated defective word line.

3. A method for inspecting a semiconductor memory device having a plurality of bit lines and a plurality of word lines, said method comprising the steps of:

boosting said bit lines forcibly to a supply voltage while feeding said word lines with ground potential; and judging a word line state based on memory cell data following the boosting of bit line.

4. A method for manufacturing a semiconductor memory device having a plurality of bit lines and a plurality of word lines, said method comprising the steps of:

boosting said bit lines forcibly to a supply voltage while feeding said word lines with ground potential;

judging a word line state based on memory cell data following the boosting of bit line; and replacing a word line judged faulty with a previously furnished redundant word line.

* * * * *